Aug. 3, 1965 D. L. BARNETT 3,198,991

AIR COOLED ELECTRONIC ENCLOSURE

Filed Feb. 26, 1964 3 Sheets-Sheet 1

INVENTOR.
DAVID L. BARNETT

BY Warren F.B. Lindsay

Aug. 3, 1965 D. L. BARNETT 3,198,991

AIR COOLED ELECTRONIC ENCLOSURE

Filed Feb. 26, 1964 3 Sheets-Sheet 2

INVENTOR.
DAVID L. BARNETT
BY Warren F. B. Lindsley

Aug. 3, 1965 D. L. BARNETT 3,198,991

AIR COOLED ELECTRONIC ENCLOSURE

Filed Feb. 26, 1964 3 Sheets-Sheet 3

INVENTOR.
DAVID L. BARNETT
BY Warren F. B. Lindsley 3,198,991
Patented Aug. 3, 1965

3,198,991

AIR COOLED ELECTRONIC ENCLOSURE

David L. Barnett, Phoenix, Ariz., assignor to General Electric Company, a corporation of New York Filed Feb. 26, 1964, Ser. No. 347,538
2 Claims. (Cl. 317—100)

This invention relates to housing for electrical components and more particularly to new and improved air cooled electronic enclosures.

With the increase in the amount of solid-state circuitry assembled on circuit cards and the density of the circuit cards packaged in an enclosure, forced air cooling of the electronic components becomes a necessity for proper functioning of the circuitry. All electronic circuitry dissipates some heat as a result of inevitable losses and serious consideration must be given to the removing of this heat since, if it cannot escape from the enclosure, the temperature of the electrical component will rise until failure occurs. Actually, the temperature of the components increases until equilibrium occurs between the heat dissipated and the heat removed.

In the past, uniform air distribution throughout an enclosure was attempted through the careful positioning of the air moving equipment and its associated turning vanes, elbows and tees. Careful designs have resulted in an air cooling system providing uniform air distribution across the circuit components with duct work and a plenum chamber; however, as soon as access doors to the enclosure housing the circuity are opened for servicing, the effectiveness of the air cooling system is destroyed. The circuity immediately over-heats, destroying the electrical components or causing protection equipment associated therewith to de-energize the circuitry.

Thus, a need exists for a new and improved enclosure for electrical components utilizing an air cooling system which will maintain the enclosure properly cooled even though an access door to the enclosure is opened and one or more of the electrical components are removed.

In accordance with the invention claimed, a new and improved enclosure is provided for housing a plurality of electrical components, such as cards or circuit boards, removably mounted therein. A plurality of handle forming surfaces are connected one to each of the components for selectively removing the components from the enclosure. These handle forming surfaces are arranged to form a continuous panel for containing air flow through the enclosure. At least one of the surfaces may be removed from the panel without substantially reducing the air flow through the enclosure.

It is, therefore, one object of this invention to provide a new and improved enclosure for electrical components in which uniform air distribution and pressure drops across the components are maintained under operating and servicing conditions.

Another object of this invention is to provide a new and improved open-sided enclosure for banks of cards supporting electrical components wherein uniform air velocities across the banks of cards are maintained even through one or more cards have been removed.

Other objects and advantages of the present invention will be apparent from the following specification when taken in conjunction with the accompanying drawings in which.

Figures 1, 2, 3:
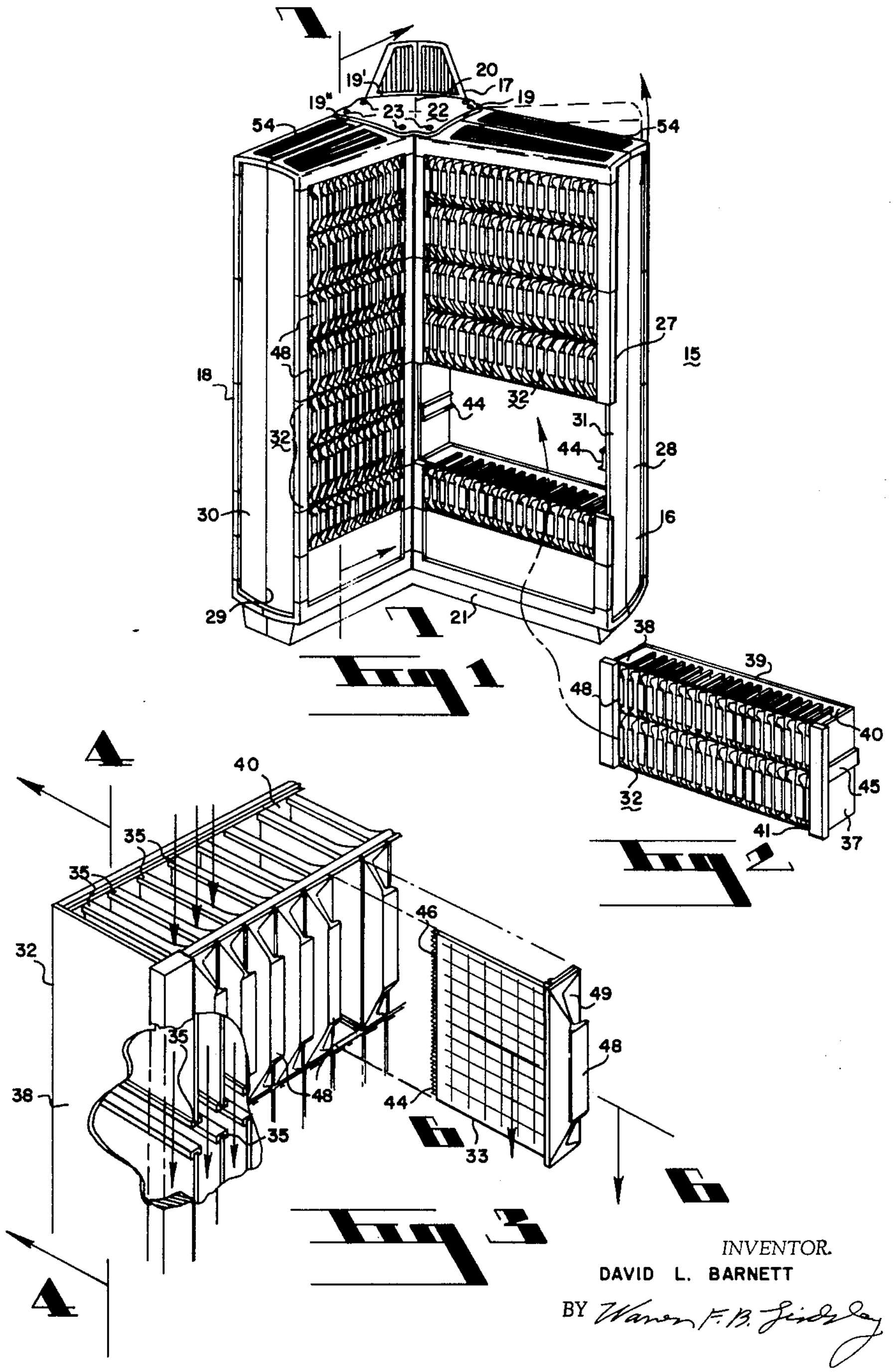
FIG. 1 is a perspective view of an electronic enclosure housing a plurality of modules and embodying the invention.
FIG. 2 is a perspective view of one of the modules removed from the enclosure shown in FIG. 1.
FIG. 3 is a perspective view partly in section of one of the modules shown in FIG 1 with one of the circuit cards withdrawn from its slot.

Referring more particularly to the drawings by characters of reference, FIGS. 1 and 2 disclose a modularly expandable electronic enclosure for a computer. Enclosure 15 comprises a plurality of cabinets 16, 17 and 18 which are so arranged in a wing shaped configuration that vertical planes through the center of each cabinet intersect along a common line 20. Line 20 is shown as being spaced an equal distance from the adjacent end surfaces 19, 19′ and 19″ of cabinets 16, 17 and 18, respectively.

The cabinets are held together in the shown configuration by a pair of horizontally arranged, vertically positioned support members 21 and 22. These support members, which are aligned and positioned such that a common axis between them is arranged transversely to their horizontal surfaces, are also coaxially arranged with line 20 formed by the intersection of the vertical planes passing through the center of each of the cabinets. Each of the cabinets is fastened to support members 21 and 22 by bolts 23, some of which form hinge connections for moving one-half of one of the cabinet sections relative to the mating other half of the cabinet section. Support member 21 forms the base supporting structure of the enclosure and together with support member 22 and the frame of the cabinets form the frame of enclosure 15.

Each of the cabinets shown comprises a pair of mating sections such as sections 27 and 28 of cabinet 16 and sections 29 and 30 of cabinet 18. Mating sections of each of the cabinets cooperate to form wings of the enclosure. Since the cabinets are shown as being identical structures, parts of various sections of different cabinets will be described in detail with the realization that similar parts are found in each section of each wing of the enclosure. In this manner, a minimum of drawing detail and description may be utilized to disclose the enclosure.

Each of the sections of the cabinets of enclosure 15 is identical to its mating section, and as shown in FIG. 1, comprises a frame 31 having a substantially parallelepipedon configuration. A plurality of modules 32 are inserted in the frame of each of the sections. Plug-in modules are used to conserve space and to facilitate replacement of various functional features of the circuitry. Each module may comprise a plurality of electrical components, for example, plug-in type circuit boards or cards 33 having a plurality of electrical elements 34, such as transistors, diodes, resistors, capacitors, choke coils and the like, mounted thereon and interconnected by electrical conductors. Each of these cards fits into separate pairs of tracks 35 attached to the framework of the module. FIGURE 6 diagrammatically illustrates these electrical elements mounted on a card. The cards shown in FIGS. 1–5, for the sake of simplicity, do not show any electrical elements mounted thereon but it is intended that these cards support the usual circuit elements in any desired circuit configuration.

The module 32 for holding cards 33 may be of any size or shape but as shown in FIGS. 2 and 3 comprises an open-faced boxlike enclosure having a pair of sidewalls 37 and 38, a back 39, an open top 40 and an open bottom 41. Suitable guideways 44, shown in FIG. 1 as being mounted on frame 31 of section 27, are provided for guiding mating rails 45 mounted on the sides of module 32 shown in FIG. 2 into a predetermined position in frame 31. All of the modules are mounted in the various frames of the sections of the cabinets in a similar manner.

The cards 33 mounted in modules 32 are provided with contacts 46 (shown in FIGS. 3 and 6) for interlocking with mating contacts 47 mounted on the back 39 of the module. These contacts fit tightly together in a friction type interlocking arrangement requiring a given amount of effort to separate the contacts upon removal of the card from the module.

Each of cards 33 is provided with a handle 48, shown more clearly in FIG. 6, which interlocks with and is supported by cards 33 to become a permanent part thereof. Handle 48 is formed preferably of a suitable insulating material such as plastic which may be molded into any suitable shape such as the shape shown in the drawings. As shown in the drawing, handle 48 is formed to provide a flat surface 49, the back of which has attached to it a slotted metallic plate 50. The slot of plate 50 is arranged to receive and interlock with the grooved end of card 33. In this position, the card and handle become a unitary structure. The card may be removed from the module as shown in FIG. 3 by merely grasping the handle 48 and pulling on it to separate the frictional contacts 46 and 47.

With the increased amount of solid-state circuitry now being assembled on the cards and the density of the cards packaged in modules arranged in housing such as enclosure 15, consideration must be given to removing the heat dissipated by the electrical elements assembled on these cards. Air moving equipment is usually placed at a low point within the enclosure and is arranged to direct air over the electrical elements mounted on the cards. This action materially aids heat transfer from the elements to the air and the removal of the heated air from around the cards.

The rate of heat dissipation of the circuit elements, the permissible temperature rise of the air from the air inlet to the air outlet of the section, and the quantity, velocity and pressure of the air required, control the size of the blower needed to accomplish the required air cooling function. Because of the packing density of the heat dissipating elements mounted on the cards, the cooling air is usually blown or drawn through the cluster of components. This requires a definite passageway for the air and a blower sealed to this passageway.

Figures 7, 8:
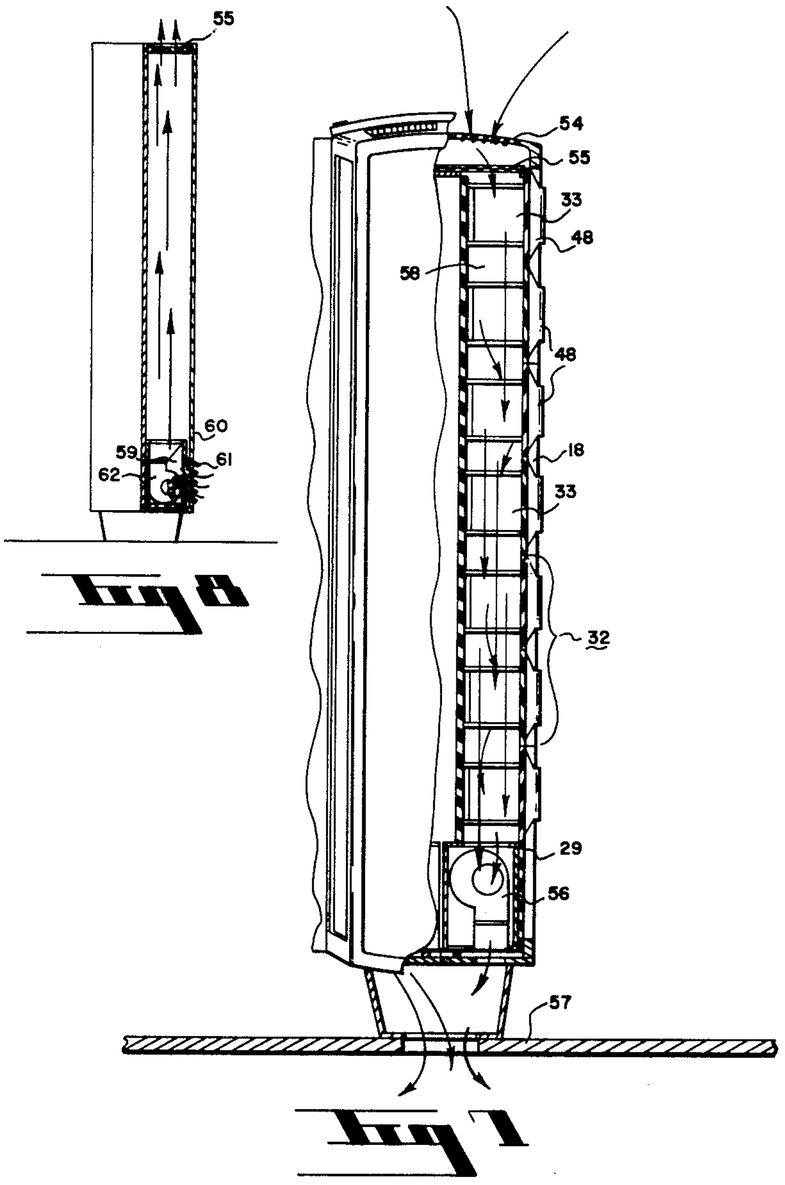
FIG. 7 is a cross sectional view of the enclosure shown in FIG. 1 taken along the line 7—7.
FIG. 8 is a cross sectional view of a modification of the enclosure shown in FIG. 1 showing air intake at the bottom of the housing and air exhaust at the top of the housing.

FIGURE 7 illustrates by means of arrows the air flow through the grillwork 54, filter 55 of section 29 of cabinet 18, the cluster of components arranged in one of the passageways, blower 56 and out the base of the cabinet into an exhaust duct arranged in flooring 57 of the building housing enclosure 15.

In accordance with the invention claimed, the circuit boards or cards 33 are vertically arranged in modules 32. More particularly, they are arranged in each module in two horizontal rows spaced vertically one from the other with corresponding cards in each row axially aligned to define vertical columns. When more thna one module is assembled in a section of the cabinet, as shown in the drawings, the columns of each module are vertically aligned with corresponding columns in the other modules. The juxtapositioned surfaces of the cards provide the walls for a plurality of passageways 58. These passageways start adjacent filter 55 and terminate adjacent blower 56.

Figure 4:
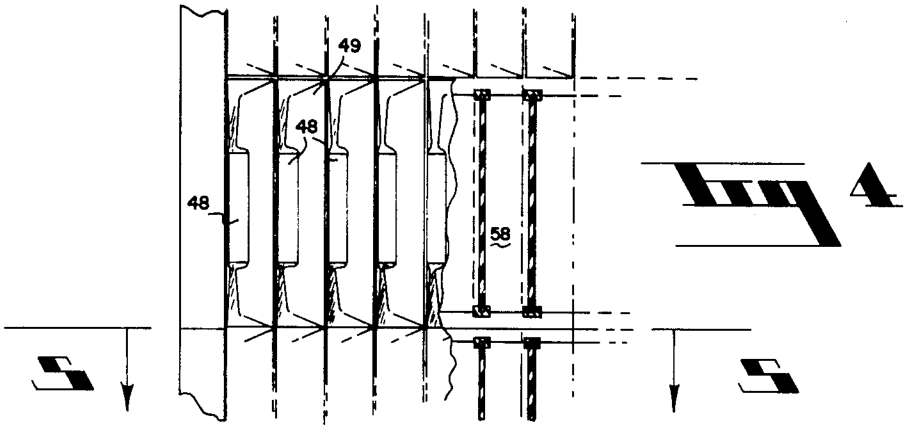
FIG. 4 is a cross sectional view of the structure shown in FIG. 3 taken along the line 4—4.
Figure 5:
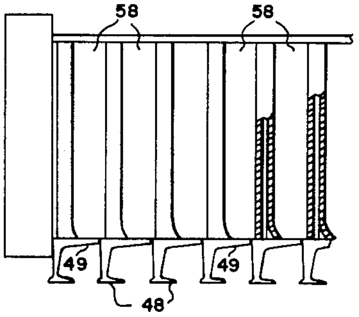
FIG. 5 is a cross sectional view of the structure shown in FIG. 4 taken along the line 5—5.
Figure 6:
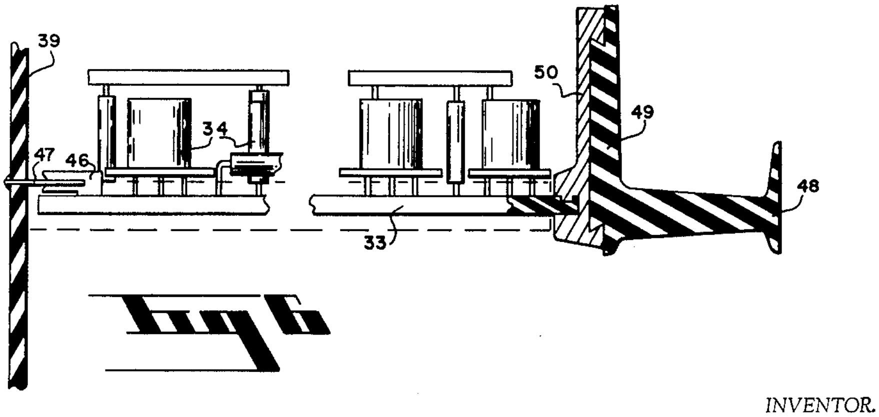
FIG. 6 is a cross sectional view of the withdrawn circuit card and handle shown in FIG. 3 taken along the line 6—6.

FIGURE 5 illustrates a plurality of these passageways extending through one of the modules of a section of a cabinet. These passageways formed by juxtapositioned surfaces of cards 33 are not isolated from one another but are actually interconnected with every other passageway at the top and bottom of each card, as shown in FIGS. 3 and 4. The inlet flow of air is divided into a plurality of streams flowing from the top of the cabinet over the clutter of electrical elements in each passageway and out the bottom of the enclosure.

Since cards 33 are arranged in predetermined rows and columns, so are the handles 48 and surfaces 49 interlocked therewith. The surface 49 associated with each card cooperates with the other surfaces to form a panel which not only closes the open sides of the modules, but also the open sides of the sections of the cabinets, thereby containing air flow through the enclosure.

When it is necessary to remove one or more cards from the enclosure, the operator or service attendant merely pulls the selected card out of the module. By so doing, he removes one small portion of the conduit or passageway wall which contains the flow of cooling air through the enclosure. This does not substantially reduce the air flow through the passageway and consequently the circuitry can continue to function without becoming overheated.

FIGURE 8 illustrates a modification of the structure shown in FIGS. 1–7 wherein the air is drawn into the bottom of section 60 of a cabinet through a suitable filter vent 61 and forced upwardly by a blower 62 into a distribution plenum 59, then through passageways 58 in the various modules 32 until it is vented through filter 55 and grillwork 54 to atmosphere. This arrangement is utilized where exhaust ducts are not available in the floor of the building housing the enclosure.

Heretofore, when an access door to an enclosure was opened to remove a card, the circuitry had to be de-energized since the cooling effect was immediately disrupted. With the disclosed invention, a new and improved housing for electrical components is provided which replaces the single access door with a plurality of doors, each of which not only serves as an entranceway to the cubicle for one card, but also serves as the handle for removing the card from the module and as a part of the wall of the conduit or passageway extending through the enclosure.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only to the true spirit and scope of the invention.

What is claimed is:

1. In combination, an enclosure having a back and an open-sided front, a plurality of circuit boards removably mounted in said enclosure, said boards being arranged in vertically spaced horizontal rows wherein corresponding boards in said rows are axially aligned in columns, the surfaces of juxtapositioned boards extending from said front to said back defining between them a plurality of vertically arranged passageways, a plurality of handle forming surfaces for connection one to each of said boards fo rselectively removing the boards from said enclosure, the handles of said handle forming surfaces extending outwardly of said enclosure, said handle forming surfaces forming a panel for closing the passageways and said enclosure, means causing air flow through said passageways, at least one of said handle forming surfaces being removable from the panel closing said enclosure without substantially reducing the effect of air flow through said enclosure.

2. In combination, an enclosure having a back and an open-sided front, a plurality of circuit boards removably mounted in said enclosure, said boards being arranged in vertically spaced horizontal rows, the surfaces of juxtapositioned boards extending from said front to said back defining between them a plurality of vertically arranged passageways, a plurality of handle forming surfaces for connection one to each of said boards for selectively removing the boards from said enclosure, the handles of said handle forming surfaces extending outwardly of said enclosure, each of said handle forming surfaces arranged in rows to form a panel for closing the open side of said enclosure and for closing the passageways, means causing air flow through said passageways, said circuit boards being arranged so the planes of their surfaces are parallel to the direction of air flow through said enclosure, at least one of said handle forming surfaces being removable from the panel closing said enclosure without substantially reducing the effect of air flow through said enclosure.

References Cited by the Examiner

UNITED STATES PATENTS

| | | | |
|---|---|---|---|
| 2,794,155 | 5/57 | Jones | 312—320 |
| 2,843,806 | 7/58 | O'Neill | 317—100 |
| 3,147,403 | 9/64 | Cressman | 174—16 X |

KATHLEEN H. CLAFFY, *Primary Examiner.*

CHANCELLOR E. HARRIS, JOHN F. BURNS, *Examiners.*